United States Patent [19]

Singletery, Jr.

[11] Patent Number: 5,200,693

[45] Date of Patent: Apr. 6, 1993

[54] METHOD FOR DETERMINING CHARACTERISTICS OF PN SEMICONDUCTOR STRUCTURES

[75] Inventor: James Singletery, Jr., Lakeview Terrace, Calif.

[73] Assignee: Cornell Research Foundation, Inc., Ithaca, N.Y.

[21] Appl. No.: 661,019

[22] Filed: Feb. 26, 1991

[51] Int. Cl.$^5$ .................. G01R 27/26; G01R 31/22
[52] U.S. Cl. ...................... 324/158 D; 324/158 R; 324/158 T
[58] Field of Search ........... 324/158 D, 158 R, 158 T; 204/401

[56] References Cited

U.S. PATENT DOCUMENTS

| | | | |
|---|---|---|---|
| 3,748,579 | 7/1973 | Henry et al. | 324/158 D |
| 3,803,489 | 4/1974 | Miller | 324/158 D |
| 4,028,207 | 6/1977 | Faktor et al. | |
| 4,101,830 | 7/1978 | Greig. | |
| 4,168,212 | 9/1979 | Faktor et al. | |
| 4,241,167 | 12/1980 | Collins et al. | 324/158 D |
| 4,319,187 | 3/1982 | Crandall | 324/158 D |
| 4,380,864 | 4/1983 | Das. | |
| 4,456,879 | 6/1984 | Kleinknecht. | |
| 4,473,795 | 9/1984 | Wood. | |
| 4,509,012 | 4/1985 | Lin | 324/158 D |
| 4,511,838 | 4/1985 | Reichman et al. | |
| 4,581,576 | 4/1986 | Wang. | |
| 4,678,989 | 7/1987 | Blood | 324/158 R |
| 4,827,212 | 5/1989 | Kamieniecki. | |
| 4,841,239 | 6/1989 | Foell et al. | 324/158 D |
| 4,859,938 | 8/1989 | Kim et al. | |
| 4,995,939 | 2/1991 | Ferenczi et al. | 204/129.2 |
| 5,036,271 | 7/1991 | Mazur et al. | 324/158 F |

OTHER PUBLICATIONS

"A Technique for Directly Plotting the Doping Profile of Semiconductor Wafers", by Salama et al, Solid St. Electron, pp. 178-181, Jul. 1970, vol. 14.

"A Feedback Method for Investigating Carrier Distributions in Semiconductors", by Milller, IEEE Trans. on Electron. Dev., vol. ED-19, #10, Oct. 1972, pp. 1103-1108.

"Doping Profile Measurements on Silicon Epitaxial Layers with Field-Controlled Planar Diodes", by Jihanyi, Solid State Elect., Dec. 1970, vol. 13, pp. 309-315, #3.

Kromer, H., "Measurement of Isotype Heterojunction Barriers by C-V Profiling", Applied Physics Letter 36 (4), Feb. 15, 1980.

Primary Examiner—Ernest F. Karlsen
Assistant Examiner—William J. Burns
Attorney, Agent, or Firm—Jones, Tullar & Cooper

[57] ABSTRACT

A method and apparatus for determining the carrier concentration and profile depth for pn semiconductor structures, and band discontinuities for heterojunction pn structures is disclosed. A more accurate measurement of carrier concentration and profile depth is obtained by initially measuring the pn junction intercept voltage of a pn semiconductor structure to be tested before the structure is exposed to a conventional capacitance-voltage (C-V) profiling process. The pn junction intercept voltage is employed to determine the pn junction capacitance which can then be compensated for in capacitance dependent formulae used for calculating the carrier concentration and profile depth. The intercept voltage can also be used to determine band discontinuities in a heterojunction pn structure. A fixed or retractable metal contact is employed to contact the p-type layer of a pn semiconductor structure to be tested and permit this initial measurement to be obtained. In a preferred form of the invention, a C-V profiling apparatus containing an electrolyte solution which etches through the structure to be tested as capacitance and current measurements are taken is employed. In the case of the fixed metal contact, the electrolyte first etches through the contact before it begins etching through the structure being tested.

8 Claims, 5 Drawing Sheets

VARIATION OF DEPLETION WIDTH W
AND CURRENT AS A FUNCTION OF
$V_A$ FOR AN IDEAL DIODE

METHOD FOR DETERMINING CHARACTERISTICS OF PN SEMICONDUCTOR STRUCTURES

BACKGROUND OF THE INVENTION

The present invention relates, in general, to the testing of semiconductor devices and more particularly to the use of capacitance measurements to obtain the carrier concentration and profile depth for all pn semiconductor structures, and band discontinuities for heterojunction pn structures.

It is known to use capacitance measurements in nondestructive testing techniques to measure various characteristics or parameters of semiconductor devices. For example, a capacitance measuring arrangement which employs a mercury probe as a Schottky contact on a semiconductor is disclosed in U.S. Pat. No. 4,101,830. Such an arrangement can be used, for example, in providing a profile of the carrier concentration vs. depth of a pn semiconductor junction. This can be achieved by making capacitance measurements on the depletion layer of the semiconductor under reverse biased conditions. The distance measured into the semiconductor is controlled by the amount of reverse bias such that the greater the reverse bias voltage, the deeper the location of the measured carrier concentration. Well established formulae relate the measured capacitance and reverse biased voltage to the carrier concentration and depth.

A major shortcoming of this testing technique is that the profile depth is limited by the breakdown voltage of the semiconductor material. Once the breakdown voltage is exceeded, too much current begins to flow, thus making the capacitance measurements unreliable. Also, the established formulae and method of profiling do not correct for the additional capacitance of the pn junction.

U.S. Pat. No. 4,168,212 describes an invention which overcomes the problem of the reverse breakdown voltage. The invention set forth in this patent employs an electrolyte in place of the mercury probe which not only forms a Schottky contact with the semiconductor, but also provides a means of profiling to any depth by etching away semiconductor material. The arrangement achieves the measurement by alternately biasing the electrolyte solution to produce an anodic dissolution reaction between the semiconductor and the electrolyte that strips a small section of the semiconductor; and then stopping the etch to make capacitance measurements on the semiconductor material, typically with the depletion region unbiased. The cycle of etching and measuring is repeated until the desired depth is reached. Again, the measured capacitance is related to the carrier concentration and depth using the same well established formulae used in the arrangement set forth in U.S. Pat. No. 4,101,830. In addition, the depth calculation is augmented by a calculation related to the dissolution current.

For n-type semiconductors, the electrochemical system utilizes anodic dissolution at a fixed potential, at a rate determined by the availability of minority carriers which are created by illuminating the material. For p-type semiconductor material, no illumination is necessary. The integral of the dissolution current provides a depth that is used along with the depletion width obtained from the capacitance measurement to yield the depth scale of the profile plot. Although this electrochemical technique is not limited by the profile depth and does an excellent job of profiling isotype structures, the technique still does not correct for the capacitance of the pn junction, and performs a less accurate job of measuring the top layers of a pn semiconductor structure.

Techniques based on the two previously discussed devices have also been developed to measure the band discontinuity of heterostructures. In his paper "Measurement of Isotype Heterojunction Barriers by C-V Profiling" (Applied Physics Letter 36(4) 15 Feb. 1980), H Kromer describes a technique using isotype heterojunctions to measure band discontinuities. By applying conservation of charge and method of moments, Kromer developed a procedure to measure band discontinuity and interface charge. By adjusting parameters such as location of interface, size of interface charge, and, most importantly, the size of band discontinuity, Kromer's theoretical plot is matched against a measured profile obtained using either of the previously discussed inventions. The measured profile is obtained using either invention, however, the use of the nondestructive technique requires a thin top layer so that profiling of both sides of the heterojunction can occur before the breakdown voltage is exceeded.

Regardless of which apparatus is used, Kromer's technique suffers from several problems. The biggest problem is the reconstruction of the carrier concentration in the space charge region generated at the heterojunction. This reconstruction is difficult because of such anomalies as Debye smearing. As a result, the measured profile could suffer from errors not corrected by the technique. For example, any attempt to identify the location of the interface, an important parameter for Kromer's technique, would be prone to error. Another important parameter prone to error is the length of the space charge, which is necessary to establish the limits of integration in the technique. Even if an accurate measurement of the carrier concentration is obtained, numerous computations may be necessary to match the calculated profile from Kromer's technique with the profile measured with the C-V technique—each iteration requiring a new guess for the band discontinuity. The total computation to obtain a reasonable estimate to the band discontinuity could take up to 30 minutes on a standard desktop personal computer. Finally, a general limitation of the isotype technique is that large band discontinuities are needed to develop a space charge region large enough to influence the shape of the measured profile.

SUMMARY OF THE INVENTION

In view of the foregoing, it is an object of the present invention to provide an improved method and apparatus for determining the carrier concentration and profile depth of a pn semiconductor structure which compensates for the capacitance of the pn junction, and therefore is more accurate than previous carrier concentration and profile depth determination techniques.

It is another object of the present invention to provide a method and apparatus for determining band discontinuities for heterojunction pn structures in a simple and accurate manner.

These and other objects of the invention are achieved with a capacitance-voltage (C-V) profiling apparatus that is similar to known profiling apparatus, but further includes a metal contact for contacting a pn semiconductor structure to be tested. This contact permits additional measurements of other characteristics of the structure that enable determination of the capacitance of the pn junction. The carrier concentration and profile depth of the structure can then be acccurately determined with particular formulae which compensate for the capacitance of the pn junction. In addition, these additional measurements allow for the determination of band discontinuities in heterojunction pn structures.

More particularly, in the method of the present invention, the intercept voltage for the pn junction is measured through use of the additional metal contact, and then the pn junction capacitance is determined from this measured voltage. This determined capacitance is then used with the measured carrier concentration and profile depth data to determine the actual carrier concentration and profile depth through use of particular equations. In the case of an abrupt pn junction, a quadratic equation is employed which can be easily solved.

The measurement of the pn junction intercept voltage also permits the determination of the conduction and valence band discontinuities in pn heterostructures through use of other formulae.

In a first preferred embodiment of the invention, the metal contact is held in contact with the pn semiconductor structure to be tested, and initial measurements are taken to determine the pn junction intercept voltage. The metal contact is then etched through by an electrolytic solution, and the etching of the pn semiconductor structure is commenced in accordance with the method disclosed in the previously discussed U.S. Pat. No. 4,168,212 to obtain the carrier concentration and profiling data.

In a second preferred embodiment, the metal contact is replaced with a retractable electrode which is moved into engagement with the pn semiconductor structure to be tested for the initial measurements, and is then retracted for the etching and profiling process.

BRIEF DESCRIPTION OF THE DRAWINGS

The foregoing and additional objects, features and advantages of the present invention become apparent to those of skill in the art from the following more detailed description of preferred embodiments thereof, taken in conjunction with the accompanying drawings, in which.

DETAILED DESCRIPTION OF THE PREFERRED EMBODIMENTS

Figure 1:
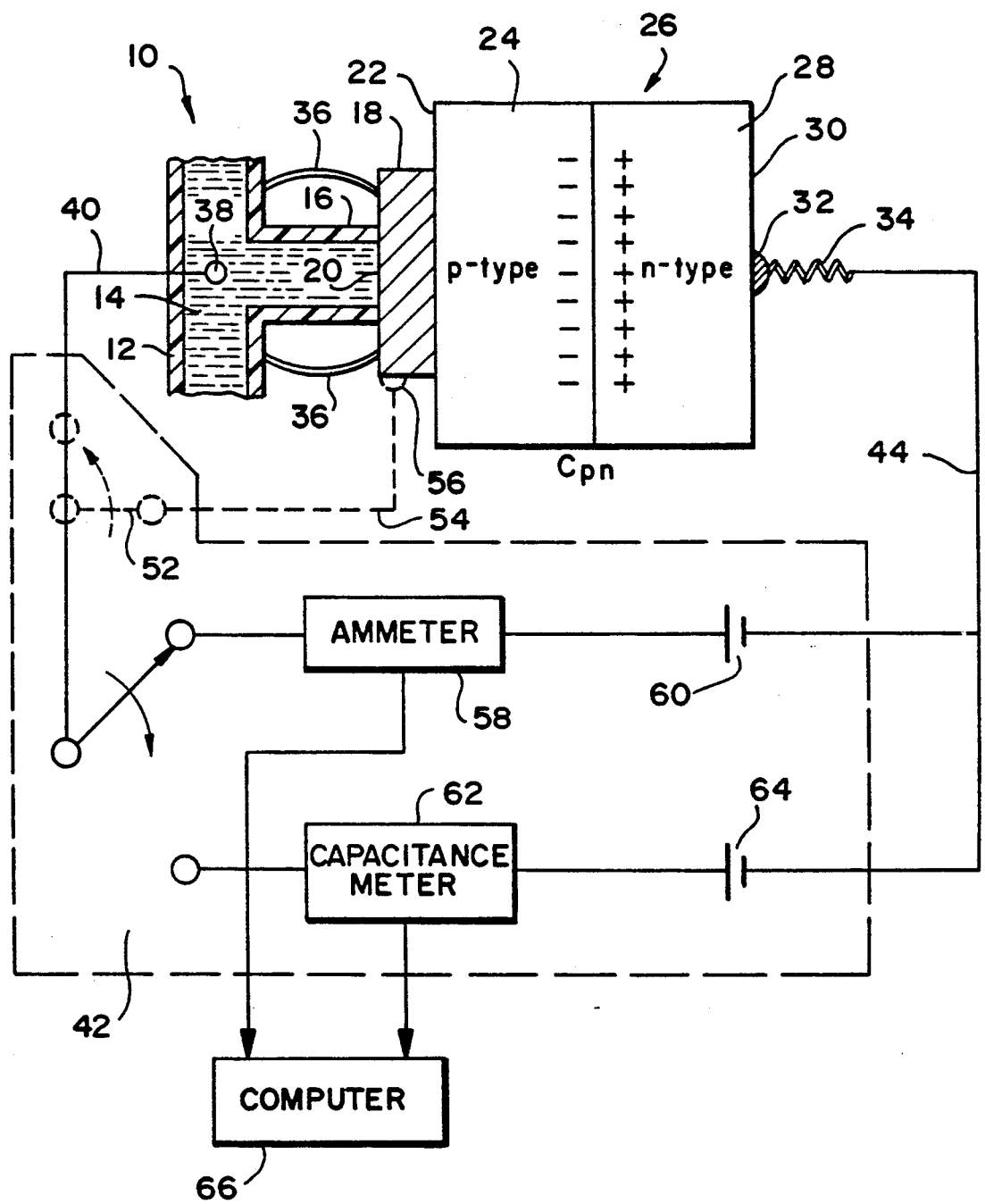
FIG. 1 is a diagrammatic illustration of a first embodiment of an electrochemical profiling apparatus constructed in accordance the present invention.

Turning now to a more detailed consideration of a first preferred embodiment of the present invention, FIG. 1 illustrates an electrochemical capacitance-voltage (C-V) profiling apparatus 10 which may be similar to the type illustrated in U.S. Pat. No. 4,168,212, or may be a commercially available Bio-Rad Model PN4300 electrochemcial C-V profiler available from Bio-Rad Microscience Division, 19 Blakestone Street, Cambridge Massachusetts. As diagrammatically illustrated, the profiler 10 includes an electrolytic cell 12 which contains an electrolytic solution 14 and includes an orifice 16. A metal contact 18 has a front side 20 which engages the orifice 18 and prevents the electrolytic solution from flowing from the orifice 16, while a back side 22 of the metal contact 18 engages a p-type layer 24 of a pn semiconductor structure 26 to be tested. An n-type layer 28 of the pn semiconductor structure 26 has a back side 30 which is engaged by an ohmic back contact 32 that is biased into contact with the structure 26 by means of a spring 34. This spring 34 also holds the metal contact 18 firmly against the orifice 16, and a pair of flexible supports 36 further help position the metal contact 18.

An electrode 38 is immersed in the electrolytic solution 14 and is connected by means of a wire 40 to a measurement electronics circuit 42, while the ohmic back contact 32 is connected via a wire 44 to the circuit 42. The measurement electronics circuit 42 includes a first switch 46 which connects the electrode 38 either to a first measurement path 48 or to a second measurement path 50. A second, optional switch 52 can be inserted in the wire 40 as indicated by the dashed lines which permits the measurement electronics circuit 42 to be connected through a wire 54 to an optional electrode 56 connected to the metal contact 18 for reasons to be discussed below.

The first measurement path 48 includes an ammeter 58 and a first voltage source 60 connected in series to the ohmic back contact 32, while the second measurement path 50 includes a capacitance meter 62 and a second voltage source 64 connected in series to the ohmic back contact 32.

The ammeter 58 and capacitance meter 62 can be connected to a computer 66 containing data acquisition software for storing periodically the measurements obtained between the electrode 38 and the back contact 32. The computer 66 may also include suitable printers and plotters for recording the data so acquired, as well as software to carry out the calculations for carrier concentration, profile depth, band discontinuity and interface charge in accordance with the method of the present invention to be discussed below.

Figure 2:
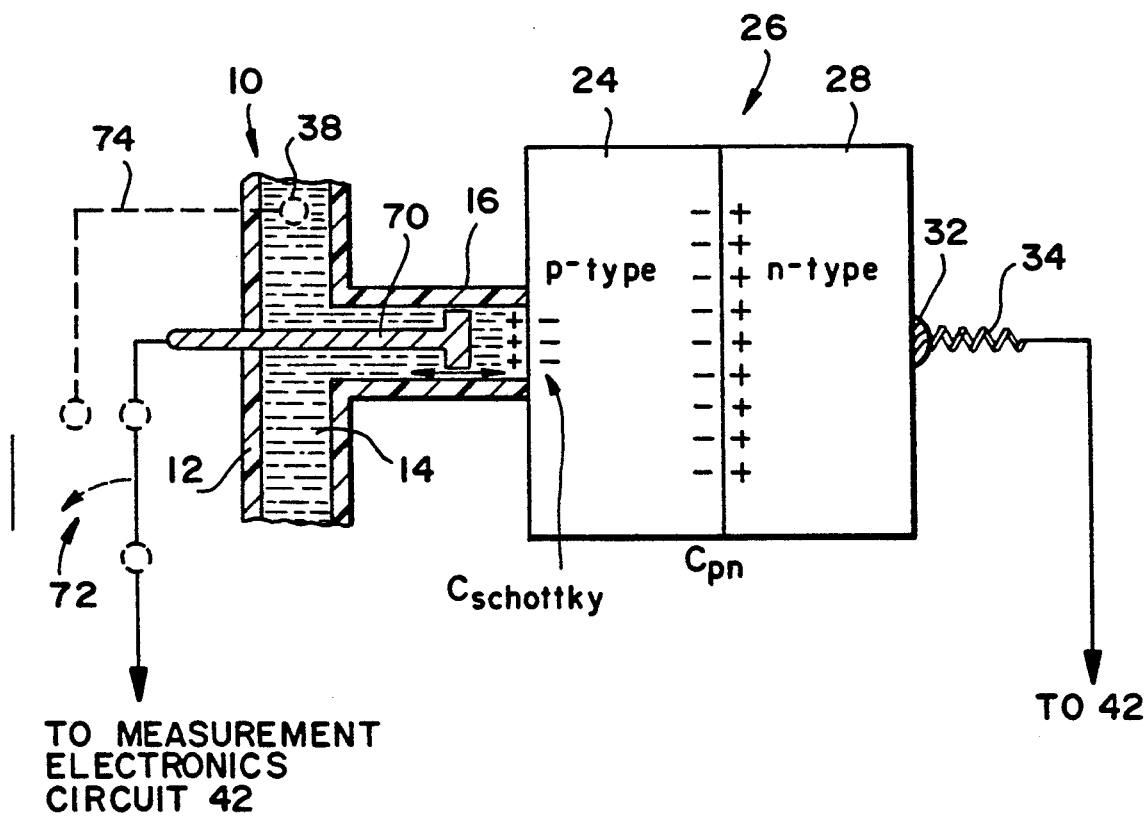
FIG. 2 is a diagrammatic illustration of a second embodiment of an electrochemical profiling apparatus constructed in accordance with the present invention.

A modification to the embodiment of FIG. 1 is illustrated in FIG. 2 in which the metal contact 18 is replaced with a retractable electrode 70 that can selectively engage the p-type layer 24 of the pn semiconductor structure 26. This arrangement eliminates the necessity that the electrolyte 14 be able to etch through the metal contact 18 as is required in the embodiment of FIG. 1. In its retracted position, the retractable electrode 70 can also serve in place of the electrode 38, however, the electrode 38 can still be employed if desired through use of a second, optional switch 72 and wire 74 as illustrated by the dashed lines in FIG. 2.

In the operation of the embodiments illustrated in FIGS. 1 and 2, the measurements are taken to determine the voltage and capacitance characteristics of the pn semiconductor structure 26 before profiling. This is accomplished with the embodiment of FIG. 1 by connecting the first switch 46 first to the first measurement path 40 and then to the second measurement path 50 in order to apply a reversed biased voltage across the pn semiconductor structure 26 and obtain initial current and capacitance measurements therefor. In the case where the metal contact 18 is chosen such that it does not form an ohmic contact with the electrolyte solution 14, the second, optional switch 52 and optional electrode 56 can be employed to obtain these initial measurements. In the case of the embodiment illustrated in FIG. 2, these initial measurements are obtained by moving the retractable electrode 70 into contact with the p-type layer 24.

Figure 3:
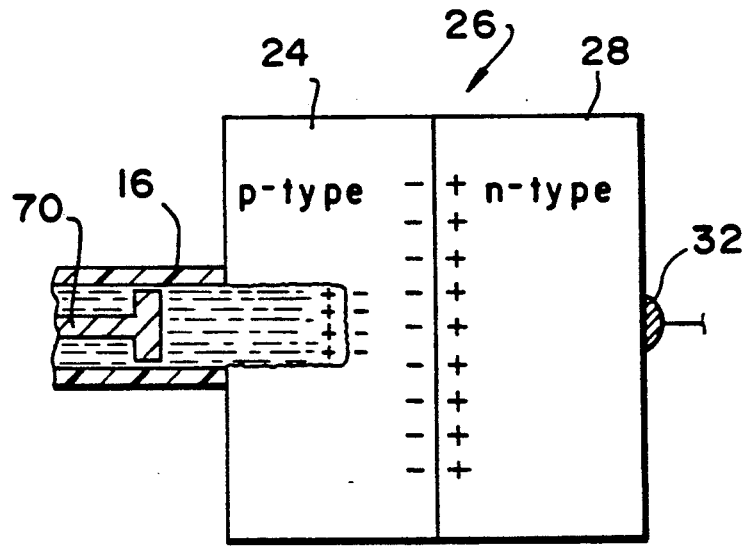
FIG. 3 is a diagrammatic illustration of the profiling apparatus of FIG. 2 illustrating one step in the method of the present invention.
Figure 4:
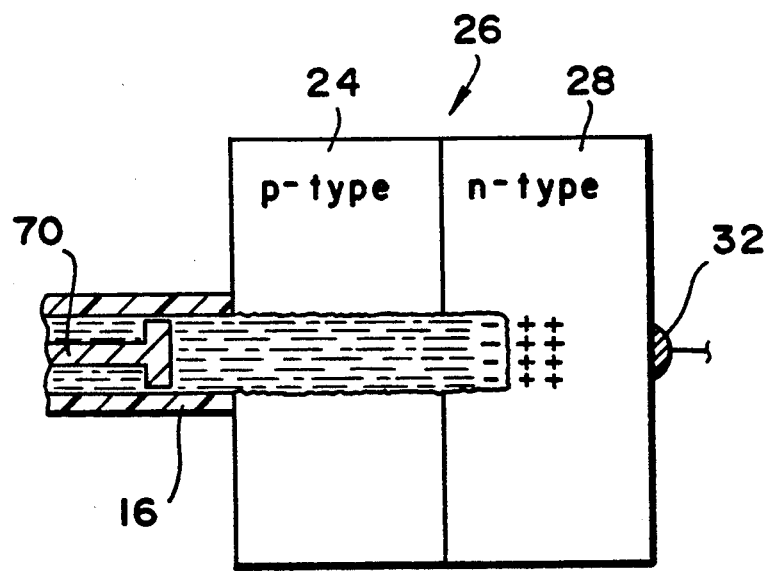
FIG. 4 is a diagrammatic illustration of the profiling apparatus of FIG. 2 illustrating another step in the method of the present invention.

Once the initial measurements are obtained, voltage is applied to the electrolyte solution 14 either with the electrode 38 or the retractable electrode 70 so that the electrolyte solution will begin to etch through the p-type layer 24 as illustrated in FIG. 3. In the case of the embodiment illustrated in FIG. 1, the electrolyte must first etch through the metal contact 18. Since the metal contact 18 and the p-type layer 24 are made from dissimilar materials, they will exhibit different etch currents for the same etch voltage. This fact can be used to detect when the electrolyte solution has etched through the metal contact 18 and begins to etch through the p-type layer 24. The junction between the electrolyte solution 14 and the pn semiconductor structure 26 is maintained reverse biased as profiling measurements are taken and the etching continues into the n-type layer 28 as illustrated in FIG. 4.

Alternatively, in the embodiment illustrated in FIG. 2, the electrolyte solution 14 can be replaced by a non-destructive fluid, such as mercury, and non-destructive profiling of the semiconductor structure 26 can be carried out as described in the previously discussed U.S. Pat. No. 4,101,630. In this case, the measurements with the retractable electrode 70 contacting the p-type layer 24 are performed after the profiling is completed to prevent any damage to the surface 22 of the p-type layer 24 that might be caused by bonding of the retractable electrode 70 thereto in order to achieve an ohmic contact.

It will be understood that the capacitance measurements obtained during the profiling of the p-type layer 24 as illustrated in FIG. 3 will reflect both the capacitance between the electrolyte solution 14 and the p-type layer 24, and the capacitance between the pn junction of the structure 26. As a result, the measurements obtained during the profiling of the p-type layer 24 cannot by themselves provide an accurate indication of the carrier concentration and profile depth in the p-type layer 24. Through use of the method of the present invention, however, these inaccuracies can be compensated for by application of the measured initial conditions and measured conditions during profiling to a number of equations as discussed below.

The method of the present invention places special constraints on the profiling of the top layer or layers of a pn structure so that the proper correction to the carrier concentration and profile depth can be made. Part of this method uses either the metal contact 18 of FIG. 1 or the retractable electrode 70 of FIG. 2 to provide an ohmic contact to the top layer 24 of the pn semiconductor structure 26 being tested, which allows for the collection of the additional electronic data needed to make the necessary corrections to the carrier concentration and profile depth. For heterostructures, these additional measurements also allow for the determination of band discontinuities.

With past inventions, the C-V profiling method was used to obtain carrier concentration, $N_{mea}$; and profile depth, $X_{mea}$, using equations 1 and 2:

$$N_{mea} = \frac{C_{mea}^3}{q\epsilon A^2 \frac{dC_{mea}}{dV_a}} \tag{1}$$

$$X_{mea} = W_r + W_D \tag{2}$$

where $C_{mea}$ is the capacitance measured across the semiconductor structure being tested; A is the area of the Schottky probe; and, $V_A$ is the voltage applied across the semiconductor structure being tested. $W_r$ is the etch depth, while $W_D$ is the depletion depth as defined by equation 3:

$$W_D = \frac{\epsilon A}{C_{mea}} \tag{3}$$

For electrochemical profiling, the etch depth, $W_r$, and depletion depth, $W_D$, are added together to obtain the profile depth. For non-destructive profiling, the etch depth does not exist, hence the profile depth is determined only by the depletion depth. What is most important to notice is that the values of the carrier concentration and profile depth depend on the proper measurement of $C_{mea}$; while the carrier concentration additionally requires the proper measurement of $dC_{mea}/dV_A$. The form of equations 1 through 3 assumes that the measured capacitance and variation in the measured capacitance is caused only by the capacitance of the electrolyte/semiconductor Schottky interface. For pn structures this is not true, instead, there is an additional capacitance generated by the pn interface. Since this capacitance is in series with the electrolyte/semiconductor Schottky junction, the measured capacitance is actually expressed by equation 4 below:

$$\frac{1}{C_{mea}} = \frac{1}{C_{Schottky}} + \frac{1}{C_{pn}} \tag{4}$$

where $C_{Schottky}$ is the capacitance of the Schottky junction formed at the electrolyte/semiconductor interface, and $C_{pn}$ is the capacitance generated by the depletion region of the pn junction.

The presence of $C_{pn}$ generates a distortion in the values for the carrier concentration and profile depth for the top layer of a pn junction. However, this invention introduces a measurement method which adjusts the measured capacitance to obtain the true carrier concentration and profile depth.

For the top layer or layers of a general pn structure, the measured profile depth can be corrected using equation 5; while the measured carrier concentration can be corrected by using the carrier concentration correction ratio expressed in equation 6:

$$X_{actual} = X_{mea} - \frac{\epsilon A}{C_{pn}} \qquad (5)$$

$$\frac{N_{actual}}{C_{Schottky}} = \frac{N_{mea}}{C_{mea}} \qquad (6)$$

Equation 5 follows from a direct substitution of equation 4 into equation 3 and the fact that the actual profile depth is only the portion of $C_{mea}$ due to $C_{Schottky}$. The validity of equation 6 rests on the proper collection of the capacitance data for the top layer. With the electrolyte/semiconductor Schottky contact in place, if the measurement of $dC_{mea}/dV_A$ can be made while keeping either $C_{Schottky}$ or $C_{pn}$ constant, then a simple expression for adjusting the carrier concentration can be developed. In the method of the present invention, the choice of keeping $C_{pn}$ constant is selected since the metal contact 18 or the additional electrode 70 allows either a direct measurement of $C_{pn}$ or an indirect measurement of $C_{pn}$ through the measurement of $V_{int(pn)}$, the intercept voltage for the pn junction of the semiconductor structure. The indirect approach is less problematic since the direct measurement of $C_{pn}$ adds a constraint to the shape of the metal contact 18 or retractable electrode 70 which has to either match the diameter of the orifice 16 used to enclose the electrolyte/semiconductor Schottky contact or, for electrodes smaller than the orifice 16, a precise scaling factor must be known. Even with such information, it is assumed that the entire metal contact 18 or retractable electrode 70 has bonded with the semiconductor surface. In reality, this assumption may not be true. Thus, the indirect method is preferred because the partial bonding of the metal contact 18 or retractable electrode 70 has no effect on the value of $V_{int(pn)}$ when it is determined from the voltage intercept of the graph of $1/C_{pn}^2$ vs. $V_A$, since the determination of $V_{int(pn)}$ using this method is independent of the electrode's contact area.

Figure 5:
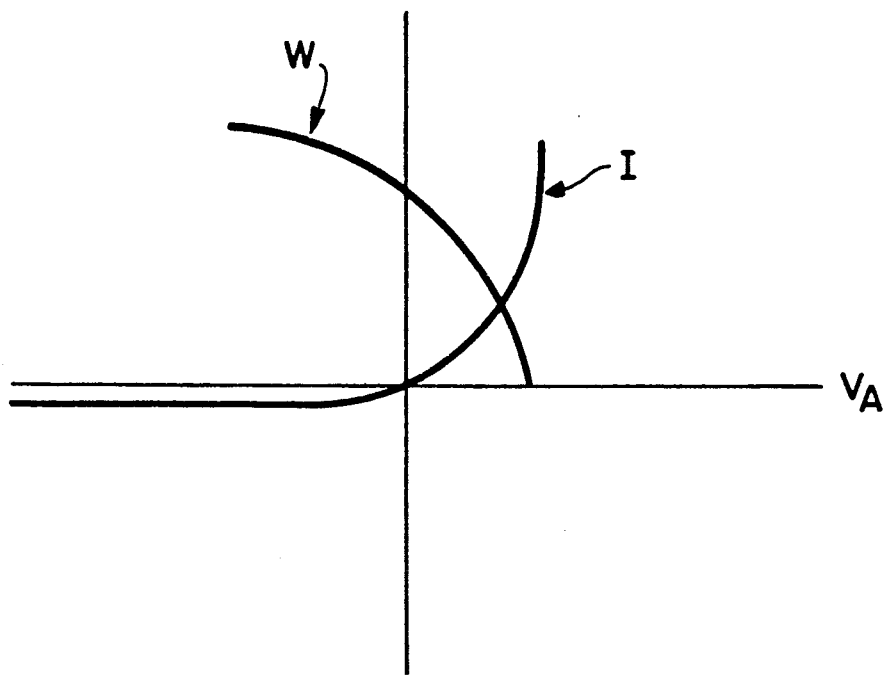
FIG. 5 is a graphical representation of a comparison of the depletion region and current variations for an ideal diode.
Figure 6:
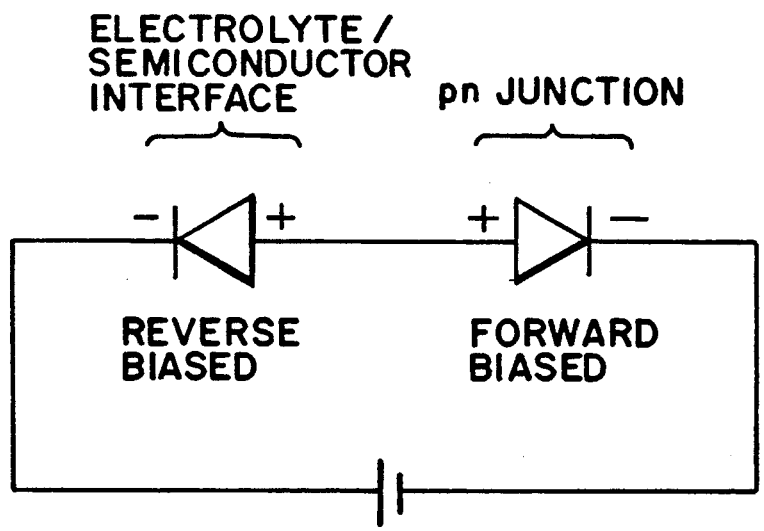
FIG. 6 is a schematic representation of a back to back diode equivalent circuit for a pn semiconductor structure undergoing profiling in accordance with the present invention.

To understand the measurement scheme which keeps $C_{pn}$ constant during profiling of the top layer of a pn structure, a comparison is necessary to demonstrate how the current and depletion width change for an ideal diode when the applied voltage is varied. Such as analysis is shown in FIG. 5. In the forward biasing region ($V_A > 0$), large changes in the current occur while the depletion width undergoes a small change. In the reverse biased region ($V_A < 0$), the opposite occurs; the reverse current only varies by a small amount while the depletion region is greatly enlarged (this trend will continue until avalanche or Zener breakdown causes a large amount of current to flow in the reverse biased region). Hence, for a situation where diodes are placed back to back as illustrated in FIG. 6, the low leakage current associated with the reverse biased junction should dictate the current through the series combination of these two diodes until the reverse bias voltage is high enough to allow a significant amount of minority carrier to survive the neutral region between the two junctions. Until this effect occurs, any changes in the applied voltage should only influence the length of the depletion region for the reverse biased junction. Furthermore, the low current for this series configuration should pin the depletion width for the forward bias region close to its unbiased value.

As illustrated in FIG. 6, the polarity of the electrolyte/semiconductor and pn junctions matches the back to back diode configuration. The IV characteristics of this arrangement seems to confirm the expected behavior of this combination. Hence, if profiling of the top layer were to occur while the electrolyte/semiconductor is kept reverse biased, the total measured capacitance would be the capacitance of the electrolyte/semiconductor interface, at its appropriate reverse biased potential, in series with the constant capacitance of the unbiased pn junction. Furthermore, any changes in the reverse bias potential should change the length of the depletion region of the electrolyte/semiconductor interface only. Hence equation 4 can be modified to reflect the unchanging capacitance at the pn junction as set forth in equation 7:

$$\frac{1}{C_{mea}} = \frac{1}{C_{Schottky}} + \text{constant} \qquad (7)$$

Also, the changes in the depletion width as the applied voltage is varied causes a change in the capacitance of the electrolyte/semiconductor interface $C_{Schottky}$ according to equation 8:

$$C_{Schottky} = \epsilon \frac{A}{\sqrt{\frac{2\epsilon(V_{intSchottky} - V_A)}{qN_{actual}}}} \qquad (8)$$

Hence, equation 7 can be transformed to:

$$\frac{1}{C_{mea}} = \frac{1}{\epsilon A} \sqrt{\frac{2\epsilon(V_{intSchottky} - V_A)}{qN_{actual}}} + \text{constant} \qquad (9)$$

The form of equation 9 provides an avenue to develop the carrier concentration correction ratio expressed in equation 6. To begin, differentiating equation 9 in terms of $C_{mea}$ and $V_A$ gives the following:

$$\frac{dC_{mea}}{C_{mea}^2} = \frac{1}{qN_{actual}A} \left[ \frac{1}{\sqrt{\frac{2\epsilon(V_{intSchottky} - V_A)}{qN_{actual}}}} \right] dV_A \qquad (10)$$

After rearranging some of the terms, equation 10 becomes:

$$\frac{dC_{mea}}{C_{mea}^2} = \frac{1}{qN_{actual}\epsilon A^2} \left[ \frac{\epsilon A}{\sqrt{\frac{2\epsilon(V_{intSchottky} - V_A)}{qN_{actual}}}} \right] dV_A \qquad (11)$$

What makes equation 11 unique is that the term in the brackets represents $C_{Schottky}$ (see equation 8). As a result, this equation can be transformed into equation 12 below:

$$\frac{N_{actual}}{C_{Schottky}} = \frac{C_{mea}^2}{q\epsilon A^2 \frac{dC_{mea}}{dV_A}} \qquad (12)$$

Equation 12 is very important since the right hand side of this expression is very close in form to the standard equation used to compute the carrier concentration from the measured capacitance (see equation 1). By dividing equation 1 by $C_{mea}$ the same expression is obtained:

$$\frac{N_{mea}}{C_{mea}} = \frac{C_{mea}^2}{q\epsilon A^2 \frac{dC_{mea}}{dV_A}} \tag{13}$$

A comparison of equations 12 and 13 gives the important carrier concentration correction ratio expressed in equation 6. Note that the derivation of this ratio placed no restrictions on the type of pn junction. Hence, the carrier concentration correction ratio is valid for homo- or heterojunctions regardless of whether the heterojunctions are lattice matched or lattice mismatched (pseudomorphic) in nature. The only requirement is that the electrolyte/semiconductor interface is modulated during the profiling of the top layer or layers and the background capacitance of the pn junction is kept constant. Applications of the carrier concentration correction ratio center on a means of determining $C_{Schottky}$ through knowledge of $C_{mea}$ and $C_{pn}$. Once the actual carrier concentration is known, then adjustments to the profile depth can then take place.

When the carrier concentration ratio is applied to the profiling of an abrupt pn homojunction the quadratic equation below results:

$$aN_{actual}^2 + bN_{actual} + c = 0 \tag{14}$$

where $$a = \frac{2V_{int(pn)}}{q\epsilon N_{sub} A^2} - \frac{1}{C_{mea}^2} \tag{15}$$

$$b = \frac{2V_{int(pn)}}{q\epsilon A^2} + \frac{2N_{mea}}{C_{mea}^2} \tag{16}$$

$$c = \frac{N_{mea}^2}{C_{mea}^2} \tag{17}$$

Since quadratic equations produce two possible solutions, only one root will be of any physical significance. As will be demonstrated later during the development of the quadratic expression, the root that gives $N_{actual} > N_{mea}$ is the proper solution. The development of this quadratic expression begins by recognizing that, for an abrupt pn homojunction, an expression for $C_{pn}$ exists that is composed of parameters whose values are either well known or can be easily measured (see equation 18 below). Since the pn junction in this situation is the constant unbiased junction, $V_A$ is set equal to zero to give equation 19. However, the expression for the correction ratio (see equation 6) does not contain the variable $C_{pn}$; but this parameter can be introduced into equation 6 by realizing that $C_{Schottky}$ can be replaced by equation 21 below:

$$\frac{1}{C} = \frac{1}{\epsilon A} \sqrt{\frac{2\epsilon(V_{int(pn)} - V_A)}{qN}} \tag{18}$$

$$\frac{1}{C} = \frac{1}{\epsilon A} \sqrt{\frac{2\epsilon V_{int(pn)}}{qN}} \tag{19}$$

where $$N = \frac{N_{sub} N_{actual}}{N_{sub} + N_{actual}} \tag{20}$$

$$\frac{1}{C_{Schottky}} = \frac{1}{C_{mea}} - \frac{1}{C_{pn}} \tag{21}$$

Using equation 21 in equation 6 results in equation 22 below:

$$N_{actual}\left(\frac{1}{C_{mea}} - \frac{1}{C_{pn}}\right) = \frac{N_{mea}}{C_{mea}} \tag{22}$$

Rearranging terms and replacing $C_{pn}$ with equation 19 gives equation 23 below:

$$\frac{N_{actual}}{\epsilon A} \sqrt{\frac{2\epsilon V_{int(pn)}}{qN}} = \frac{1}{C_{mea}}(N_{actual} - N_{mea}) \tag{23}$$

Equation 23 is important since it helps identify the proper root to select from the quadratic equation. Because the left side of equation 23 and $C_{meas}$ are positive numbers for all real devices, then $N_{actual}$ must be greater than $N_{mea}$. This is an important fact to keep in mind since solving the quadratic equation in this case generates one solution greater than $N_{mea}$ and one solution less than $N_{mea}$.

The development of the quadratic equation begins by squaring both sides of equation 23 which results in equation 24 below:

$$\frac{N_{actual}^2}{\epsilon^2 A^2}\left(\frac{2\epsilon V_{int(pn)}}{qN}\right) = \tag{24}$$

$$\frac{1}{C_{mea}^2}(N_{actual}^2 + N_{mea}^2 - 2N_{actual}N_{mea})$$

Since N in equation 24 can be expressed in terms of a parameter that is easily measured, $N_{mea}$, and the parameter for which a solution is being sought, $N_{actual}$, equation 20 is used in equation 24 to give equation 25 below:

$$\frac{2V_{int(pn)}}{q\epsilon A^2 N_{sub}}(N_{sub}N_{actual} + N_{actual}^2) = \tag{25}$$

$$\frac{1}{C_{mea}^2}(N_{actual}^2 + N_{mea}^2 - 2N_{actual}N_{mea})$$

From equation 25, common terms involving $N_{actual}^2$ and $N_{actual}$ can be collected to generate equation 26 below:

$$N_{actual}^2\left(\frac{2V_{int(pn)}}{q\epsilon A^2 N_{sub}} - \frac{1}{C_{mea}^2}\right) + \tag{26}$$

$$N_{actual}\left(\frac{2V_{int(pn)}}{q\epsilon A^2} + \frac{2N_{mea}}{C_{mea}^2}\right) - \frac{N_{mea}^2}{C_{mea}^2} = 0$$

Equation 26 matches the quadratic equation and coefficients expressed in equations 14 through 17.

Figure 7:
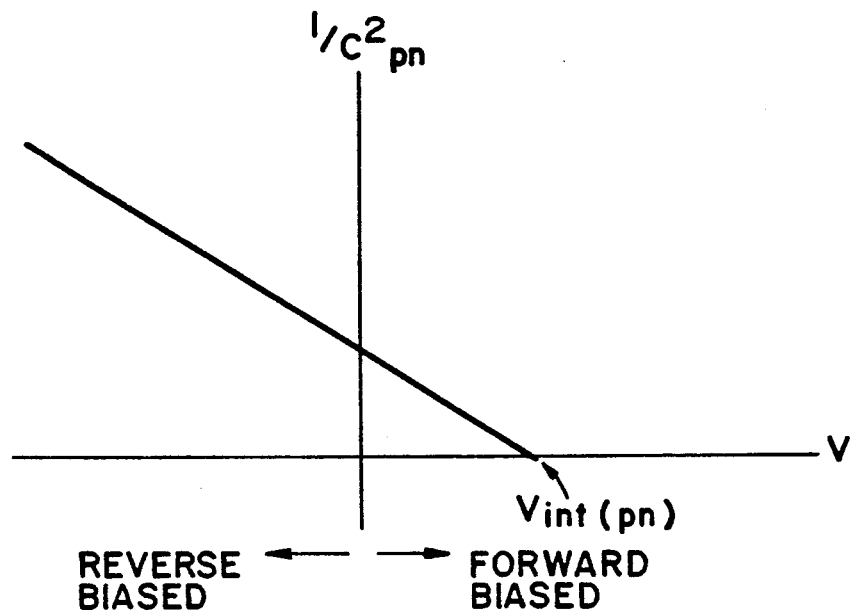
FIG. 7 is a graphical representation of the plot of $1/C^2$ pn vs. voltage for an abrupt pn junction; and, FIG. 8 is a graphical representation of a comparison between a corrected and an uncorrected carrier concentration profile.

The procedure that is used to obtain the parameters used in equations 14 through 17 begins with the measurement of $V_{int(pn)}$. This measurement requires the use of the special modification that is part of this invention. The metal contact 18 or the retractable electrode 70 is placed in contact with the semiconductor surface as in FIGS. 1 and 2, and the measurement path is set to bypass the electrolyte/semiconductor Schottky junction. In this configuration, capacitance/voltage measurements are performed and $V_{int(pn)}$ is extracted from the voltage intercept of the $1/C_{pn}^2$ vs. V plot as illustrated in FIG. 7.

After $V_{int(pn)}$ is determined, the apparatus is returned to its normal configuration to perform capacitance/voltage profiling of the semiconductor surface. In performing the profiling for the top surface, $V_{mea}$ is set to insure that the Schottky junction is reversed biased and low current flows through the device. This is done to insure the veracity of the carrier concentration correction ratio. Profiling of the top layer provides the values for $N_{mea}$, $C_{mea}$ and $X_{mea}$ (a parameter that is used later to correct the profile depth) which are stored in the computer's memory for later use. After the top layer is profiled, $V_{mea}$ is adjusted to insure the proper profiling of the bottom layer. Since there is no background capacitance during this phase of the procedure, the original profiling equations 1 through 3 accurately measure the carrier concentration and profile depth. Since the bottom substrate is uniformly doped, the measured value of $N_{sub}$ is taken as a constant.

Upon completion of the measurement and storage of the above data, the values for $N_{actual}$ are obtained using (1) the collected data for $N_{mea}$, $C_{mea}$ and $N_{sub}$, (2) the area of the orifice 16 for A, and (3) the values for q and $\epsilon$ that are well known. Since each $N_{mea}$ is coupled to an $X_{mea}$, once $N_{actual}$ is known, $X_{mea}$ is adjusted using equation 27 below, which follows from substituting equation 19 and 20 into equation 5:

$$X_{actual} = X_{mea} - \sqrt{\frac{2\epsilon V_{int(pn)}}{q}\left[\frac{N_{sub} + N_{actual}}{N_{sub}N_{actual}}\right]} \quad (27)$$

Figure 8:
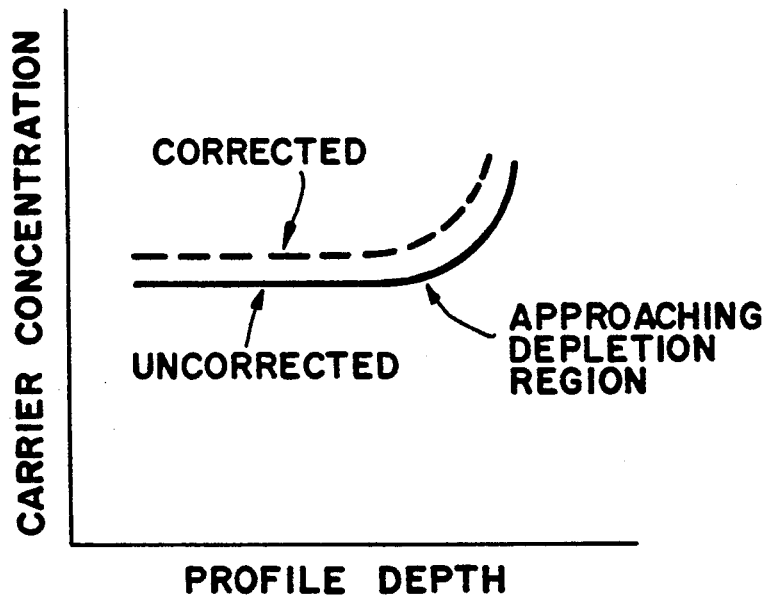

The corrections to the carrier concentrations and profile depth would continue until the depletion region of the pn junction is reached which is normally indicated by an unwarranted sharp rise in $N_{mea}$. An illustration of a corrected plot in comparison to an uncorrected plot is shown in FIG. 8.

Application of the present invention to a pn heterostructure not only results in adjustments to the carrier concentration and profile depth, but also provides a means to estimate the conduction and valence band discontinuities which exist at the heterojunction interface. When the carrier concentration correction ratio is used to adjust their concentration of the top layer, the same quadratic expression as equation 14 results with the coefficients a and b modified to reflect the different permittivities for the top and bottom layers as indicated by the following equations:

$$a'N_{actual}^2 + b'N_{actual} + c = 0 \quad (28)$$

where $$a' = \frac{2V_{int(pn)}}{q\epsilon N_{sub}A^2} - \frac{1}{C_{mea}^2} \quad (29)$$

$$b' = \frac{2V_{int(pn)}}{q\epsilon A^2} + \frac{2N_{mea}}{C_{mea}^2} \quad (30)$$

$$c = -\frac{N_{mea}^2}{C_{mea}^2} \quad (31)$$

The adjustments to coefficients a' and b' originate from the capacitance expression for a pn heterostructure for which the interface charge is insignificant:

$$\frac{1}{C_{pn}} = \frac{1}{A}\sqrt{\frac{2(\epsilon_{sub}N_{sub} + \epsilon_{top}N_{actual})}{qN_{sub}N_{actual}\epsilon_{sub}\epsilon_{top}}(V_{int(pn)} - V_A)} \quad (32)$$

When equation 32 is used in place of equation 18 and the derivation steps from equations 19 to 26 are repeated, then the results expressed in equations 28 through 31 are obtained.

The exact measurement procedure used to obtain the pn homojunction parameters are also used with this application in order to obtain $N_{actual}$. Once this is determined, the corresponding $X_{mea}$ is adjusted using equation 33 below:

$$X_{actual} = X_{mea} - \sqrt{\frac{2\epsilon_{top}(\epsilon_{sub}N_{sub} + \epsilon_{top}N_{actual})}{q\epsilon_{sub}N_{sub}N_{actual}}V_{int(pn)}} \quad (33)$$

In addition to the corrections to the carrier concentration and profile depth, knowledge of $V_{int(pn)}$ allows for the determination of the conduction and valence band discontinuities using equation 34 through 36 below:

$$\Delta E_C = E_{gtop} + kT\ln\left[\frac{N_{actual}N_{sub}}{N_V N_C}\right] - qV_{bipn} \quad (34)$$

$$V_{bipn} = V_{intpn} + 2\frac{kT}{q} \quad (35)$$

$$\Delta E_V = E_{gtop} - E_{gsub} - \Delta E_C \quad (36)$$

Note that equation 36 reflects the adjustment of $V_{int(pn)}$ to obtain the built-in potential of the pn junction.

Thus, the present invention provides a method and apparatus for more accurate measurement of carrier concentration and profile depth for a pn structure, which is achieved by compensating for the background capacitance of the pn junction. This compensation requires a special procedure for the collection of capacitance data to insure that the correction ratio remains valid. When applied to abrupt pn structures, the correction ratio becomes a quadratic equation, the coefficients of which are easily measured to permit a straightforward and accurate resolution of inconsistencies between C-V measurements and expected results. One of the measured parameters, $V_{int(pn)}$, is also useful in determining the bank discontinuities in pn heterostructures. The information provided by this invention is useful in characterizing materials used with semiconductor lasers, solar cells and solid state microwave devices.

Although the present invention is described in terms of preferred embodiments. It will be understood that numerous variations and modifications could be made thereto without departing from the scope and spirit thereof as defined by the following claims. For example, the shape, dimensions and positioning of various embodiments can be changed to improve the bonding of the metal contact 18 or retractable electrode 70. Different materials and solutions can also be employed to develop better ohmic and Schottky contacts. The profiling and measurement procedure can be reversed to obtain $V_{int(pn)}$ for the non-destructive profiling method, and the present invention can be applied to pn structures where the top and bottom layers are reversed. The present invention can also be applied to multiple p and multiple n layer structures, as well as to isotype junctions if these junctions have the ability to rectify. Finally, the present invention could be used to develop a method to measure the interface charge accurately, thus increasing the usefulness of the present invention for pseudomorphic (i.e. lattice mismatched) heterostructures.

What is claimed is:

1. A method of determining the carrier concentration and profile depth in a pn semiconductor structure comprising the steps of:
    measuring the pn junction intercept voltage of said semiconductor structure to be tested;
    determining the pn junction capacitance, $C_{pn}$, of said semiconductor structure to be tested from said measured intercept voltage;
    measuring the carrier concentration and profiling depth of said structure; and,
    determining the actual carrier concentration and profile depth from said determined pn junction capacitance and said measured carrier concentration and profiling depth.

2. The method of claim 1 wherein said step of measuring the carrier concentration and profiling depth comprises placing the structure to be tested in a capacitance-voltage profiling apparatus, and obtaining said carrier concentration and profile depth measurements with said profiling apparatus.

3. The method of claim 2 wherein said step of measuring the pn junction intercept voltage comprises:
    applying a voltage across the pn semiconductor structure to be tested to reverse bias said structure;
    measuring the capacitance, $C_{mea}$, across said structure; and,
    determining the pn junction intercept voltage of said structure from the values of said applied voltage and measured capacitance.

4. The method of claim 3 wherein the step of determining the actual carrier concentration and profile depth comprises:
    determining the Schottky capacitance, $C_{Schottky}$, of said pn semiconductor structure from said determined pn junction capacitance, $C_{pn}$, and said measured capacitance, $C_{mea}$, across said structure using the equation:

$$\frac{1}{C_{mea}} = \frac{1}{C_{Schottky}} + \frac{1}{C_{pn}} ;$$

determining the actual carrier concentration, $N_{actual}$, from the measured carrier concentration, $N_{mea}$, the measured capacitance across said structure, $C_{mea}$, and the determined Schottky capacitance, $C_{Schottky}$, from the equation:

$$\frac{N_{actual}}{C_{Schottky}} = \frac{N_{mea}}{C_{mea}} ; \text{and,}$$

determining the actual profile depth, $X_{actual}$, from the measured profile depth, $X_{mea}$, and the determined pn junction capacitance, $C_{pn}$, using the equation:

$$X_{actual} = X_{mea} - \frac{\epsilon A}{C_{pn}},$$

where $\epsilon$ is the permittivity of the semiconductor structure and A is the area of a contact employed to apply voltage across said pn semiconductor structure.

5. The method of claim 1 further including the step of determining conduction and valence band discontinuities from said measured pn junction intercept voltage which exist at the pn junction interface if said pn semiconductor structure is a heterostructure.

6. The method of claim 3, wherein said step of applying a voltage across the pn semiconductor structure comprises engaging a first layer of said semiconductor structure with a first ohmic contact, and engaging a second layer of said semiconductor structure with a second ohmic contact; and
    applying a voltage across said first and second ohmic contacts to reverse bias said semiconductor structure.

7. The method of claim 6, further comprising the step of retracting said first ohmic contact away from said first layer to permit measurement of carrier concentration and profile depth of said semiconductor structure.

8. The method of claim 6, wherein said step of measuring the carrier concentration and profiling depth further comprises:
    exposing said first layer and said first ohmic contact to an electrolyte solution;
    applying a voltage to said electrolyte solution to thereby cause said solution to etch through said first ohmic contact and said semiconductor structure; and
    measuring the carrier concentration and profile depth as said semiconductor structure is etched.

* * * * *